United States Patent
Lin et al.

(10) Patent No.: US 11,744,085 B2
(45) Date of Patent: Aug. 29, 2023

(54) SEMICONDUCTOR DEVICES AND METHODS OF FORMING SEMICONDUCTOR DEVICES WITH LOGIC AND MEMORY REGIONS INSULATION LAYERS

(71) Applicant: GLOBALFOUNDRIES Singapore Pte. Ltd., Singapore (SG)

(72) Inventors: Benfu Lin, Singapore (SG); Yi Jiang, Singapore (SG); Lup San Leong, Singapore (SG); Juan Boon Tan, Singapore (SG)

(73) Assignee: GLOBALFOUNDRIES Singapore Pte. Ltd., Singapore (SG)

(*) Notice: Subject to any disclaimer, the term of this patent is extended or adjusted under 35 U.S.C. 154(b) by 142 days.

(21) Appl. No.: 17/016,416

(22) Filed: Sep. 10, 2020

(65) Prior Publication Data
US 2022/0077234 A1    Mar. 10, 2022

(51) Int. Cl.
*H10B 63/00* (2023.01)
*G11C 13/00* (2006.01)
*H10N 70/20* (2023.01)

(52) U.S. Cl.
CPC ......... *H10B 63/30* (2023.02); *G11C 13/0002* (2013.01); *G11C 13/0021* (2013.01); *H10N 70/20* (2023.02); *H10N 70/231* (2023.02)

(58) Field of Classification Search
CPC ..... H01L 27/2436; H01L 45/04; H01L 45/06; H01L 27/222; H01L 27/2463; H01L 45/1233; H01L 45/16; G11C 13/0002; G11C 13/0021; G11C 11/161; G11C 2213/50; H10B 63/30; H10B 61/00; H10B 63/80; H10N 70/20; H10N 70/231; H10N 70/011; H10N 70/826; H10N 70/801
See application file for complete search history.

(56) References Cited

U.S. PATENT DOCUMENTS

| | | | |
|---|---|---|---|
| 8,674,465 B2 | 3/2014 | Li et al. | |
| 9,704,919 B1 | 7/2017 | Lu et al. | |
| 2018/0018263 A1* | 1/2018 | Cho | H01L 43/08 |
| 2019/0140019 A1* | 5/2019 | Nagel | H01L 27/226 |
| 2021/0336130 A1* | 10/2021 | Chien | H01L 43/12 |

OTHER PUBLICATIONS

Lin et al., "45nm Low Power CMOS Logic Compatible Embedded STT MRAM Utilizing a Reverse-Connection 1T/1MTJ Cell", 2009 IEEE International Electron Devices Meeting (IEDM), 2009, 4 pages, IEEE.

* cited by examiner

*Primary Examiner* — Jerome Leboeuf
(74) *Attorney, Agent, or Firm* — VIERING JENTSCHURA & PARTNER MBB

(57) ABSTRACT

A semiconductor device includes a first insulating layer; a second insulating layer arranged over the first insulating layer; a memory structure arranged within a memory region and including a resistance changing memory element within the first insulating layer; and a logic structure arranged within a logic region. In the memory region, the first insulating layer may contact the second insulating layer and in the logic region, the semiconductor device may further include a stop layer arranged between the first insulating layer and the second insulating layer.

20 Claims, 13 Drawing Sheets

SEMICONDUCTOR DEVICES AND METHODS OF FORMING SEMICONDUCTOR DEVICES WITH LOGIC AND MEMORY REGIONS INSULATION LAYERS

TECHNICAL FIELD

The present disclosure relates generally to semiconductor devices, and methods of forming the semiconductor devices.

BACKGROUND

Non-volatile memory structures are commonly used in consumer electronic products such as smart phones and tablets. The memory structures are often included as part of a semiconductor device within the consumer electronic product, where the semiconductor device usually includes a logic structure as well.

During fabrication of the semiconductor device, the memory structures may first be formed and insulating material may then be deposited over the memory structures. Due to the presence of the memory structures, the surface topology of the insulating material over these structures is typically greater as compared to other portions of the insulating material. To reduce this surface topology, an etch back process is often performed on the insulating material using a reverse mask. However, this etch back process tends to damage the surface of the insulating material. For example, a certain amount of polymer residue from the reverse mask may remain on the insulating material's surface after the etch back process, as it is usually difficult to completely remove the polymer (even if the surface is cleaned using diluted hydro-fluoric acid (DHF)). As a result, there may be delamination of the insulating material from the material subsequently deposited over it. This may in turn result in time dependent dielectric breakdown (TDDB) of the interface between these materials, and may thus cause chip package interaction (CPI) issues.

Therefore, it is desirable to provide an improved semiconductor device with reduced surface topology in its layers and increased reliability.

SUMMARY

According to various non-limiting embodiments, there may be provided a semiconductor device including: a first insulating layer; a second insulating layer arranged over the first insulating layer; a memory structure arranged within a memory region and including a resistance changing memory element within the first insulating layer; and a logic structure arranged within a logic region; where in the memory region, the first insulating layer may contact the second insulating layer and in the logic region, the semiconductor device may further include a stop layer arranged between the first insulating layer and the second insulating layer.

According to various non-limiting embodiments, there may be provided a method for fabricating a semiconductor device. The method may include: forming a memory structure within a memory region; forming a first insulating layer over the memory structure, where the memory structure may include a resistance changing memory element within the first insulating layer; forming a stop layer partially over the first insulating layer; forming a second insulating layer over the first insulating layer; and forming a logic structure within a logic region; where in the memory region, the first insulating layer may contact the second insulating layer and in the logic region, the stop layer may be arranged between the first insulating layer and the second insulating layer.

According to various non-limiting embodiments, there may be provided a semiconductor device including: a first insulating layer; a second insulating layer arranged over the first insulating layer; a memory structure arranged within a memory region, and including a resistance changing memory element within the first insulating layer; a memory contact arranged within the memory region and extending through at least the second insulating layer; and a logic structure arranged within a logic region; where the first insulating layer and the second insulating layer may be formed of different materials.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. Non-limiting embodiments of the invention will now be illustrated for the sake of example only with reference to the following drawings, in which.

DETAILED DESCRIPTION

Figure 1:
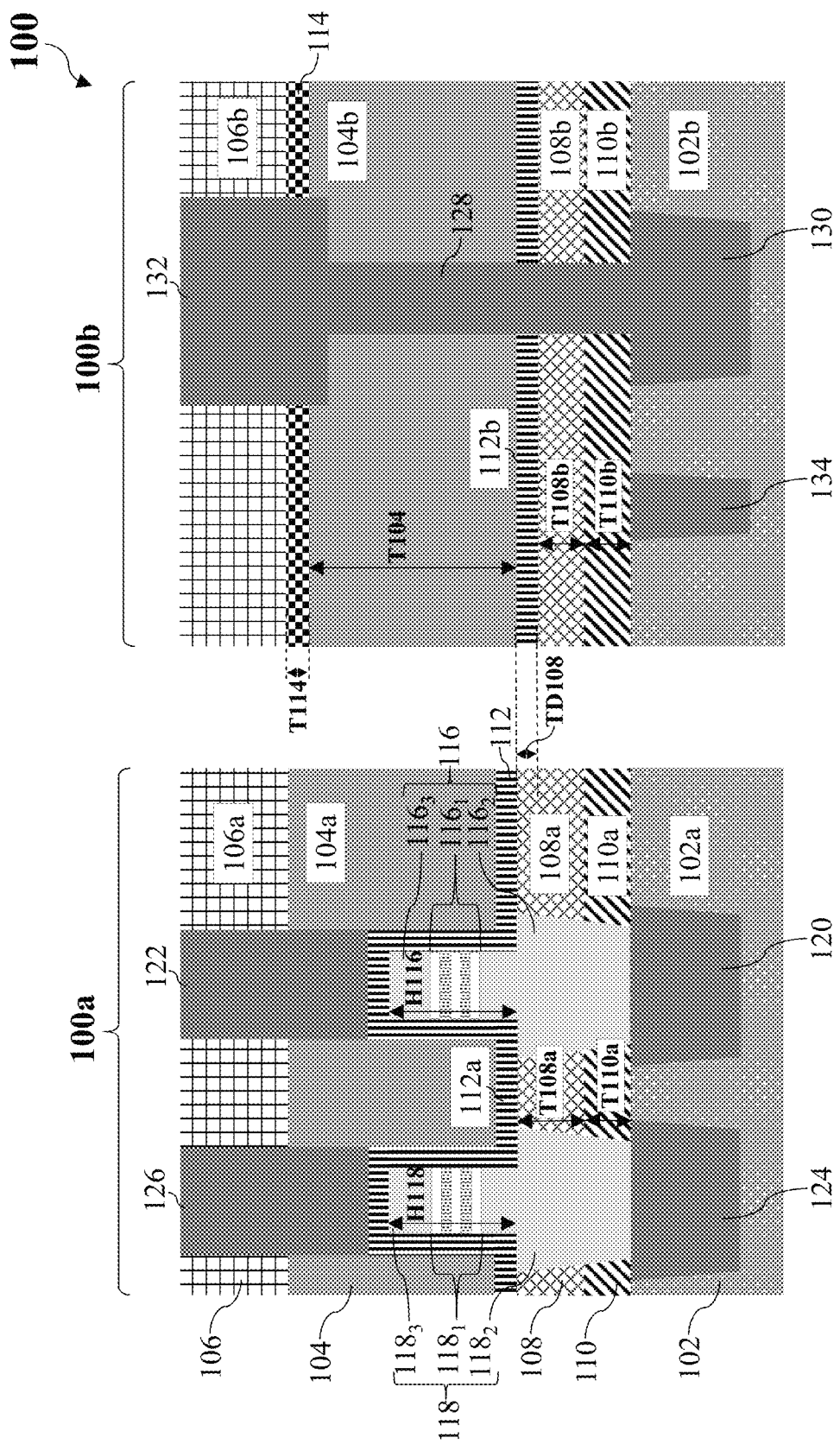
FIG. 1 shows a simplified cross-sectional view of a semiconductor device according to various non-limiting embodiments.

The embodiments generally relate to semiconductor devices. More particularly, some embodiments relate to semiconductor devices having a memory region with an embedded memory structure and a logic region with a logic structure. The semiconductor devices may be used in several applications, such as, but not limited to, multimedia and communication applications.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "approximately", "about," is not limited to the precise value specified. In some instances, the approximating language may correspond to the precision of an instrument for measuring the value. Further, a direction is modified by a term or terms, such as "substantially" to mean that the direction is to be applied within normal tolerances of the semiconductor industry. For example, "substantially parallel" means largely extending in the same direction within normal tolerances of the semiconductor industry and "substantially perpendicular" means at an angle of ninety degrees plus or minus a normal tolerance of the semiconductor industry.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

FIG. 1 shows a simplified cross-sectional view of a semiconductor device 100 according to various non-limiting embodiments.

Referring to FIG. 1, the semiconductor device 100 may include a base layer 102. The base layer 102 may include insulating material, such as, but not limited to, carbon-doped silicon oxide (SiCOH). For example, the base layer 102 may be an inter-layer dielectric (ILD) layer.

The memory device 100 may further include a first insulating layer 104, a second insulating layer 106 and a further insulating layer 108. As shown in FIG. 1, the base layer 102 may be arranged under the further insulating layer 108. The further insulating layer 108 may be arranged under the first insulating layer 104, and the second insulating layer 106 may be arranged over the first insulating layer 104. Each of the insulating layers 104, 106, 108 may be an inter-layer dielectric (ILD) layer. Further, each of the insulating layers 104, 106, 108 may include insulating material, such as, but not limited to, carbon-doped silicon oxide (SiCOH), tetraethyl orthosilicate (TEOS) or combinations thereof. The insulating material used for each of the insulating layers 104, 106, 108 may have a low dielectric constant. For example, the dielectric constant of the insulating material used for each of the insulating layers 104, 106, 108 may range from about 1.8 to about 4. The base layer 102 and the insulating layers 104, 106, 108 may be formed of a same material. Alternatively, two or more of the base layer 102 and the insulating layers 104, 106, 108 may be formed of different materials. For example, the first insulating layer 104 and the second insulating layer 106 may be formed of different materials. For example, the further insulating layer 108 may be formed of a different material from the other layers 102, 104, 106. In a non-limiting embodiment, the further insulating layer 108 may include a material with a lower porosity as compared to the materials of the base layer 102, the first insulating layer 104 and the second insulating layer 106. In an alternative non-limiting embodiment, the further insulating layer 108 may include a material with a lower dielectric constant than the materials of the base layer 102, the first insulating layer 104 and the second insulating layer 106. For example, the base layer 102, and the first and second insulating layers 104, 106 may include SiCOH and the further insulating layer 108 may include TEOS.

Referring to FIG. 1, the semiconductor device 100 may further include a blocking layer 110 arranged between the base layer 102 and the further insulating layer 108. The blocking layer 110 may include blocking material, such as, but not limited to, nitrogen-doped silicon carbide (Nblok). In addition, the semiconductor device 100 may include a protective layer 112 between the first insulating layer 104 and the further insulating layer 108. The protective layer 112 may include protective material, such as, but not limited to, silicon nitride.

The semiconductor device 100 may include a memory region 100a and a logic region 100b. Referring to FIG. 1, each of the base layer 102, the first insulating layer 104, the second insulating layer 106, the further insulating layer 108, the blocking layer 110 and the protective layer 112 may include a first portion 102a, 104a, 106a, 108a, 110a, 112a in the memory region 100a and a second portion 102b, 104b, 106b, 108b, 110b, 112b in the logic region 100b. The first portion 102a, 104a, 106a, 110a, 112a of the base layer 102, first insulating layer 104, second insulating layer 106, blocking layer 110 and protective layer 112 may have a thickness approximately equal to a thickness of the second portion 102b, 104b, 106b, 110b, 112b of the respective layers 102, 104, 106, 110, 112. For example, a thickness T104 of both the first and second portions 104a, 104b of the first insulating layer 104 may be about the same, and may range from about 150 nm to about 180 nm. In one non-limiting embodiment, this thickness T104 may be about 165 nm. However, a thickness T108a of the first portion 108a of the further insulating layer 108 may be greater than a thickness T108b of the second portion 108b of the further insulating layer 108. The difference TD108 in the thicknesses T108a, T108b of the first portion 108a and the second portion 108b of the further insulating layer 108 may range from about 22 nm to about 42 nm, and in one non-limiting embodiment, may be about 32 nm. A combined thickness T108a+T110a of the first portions 108a, 110a of the further insulating layer 108 and the blocking layer 110 may range from about 80 nm to about 90 nm and may be about 85 nm in a non-limiting embodiment; whereas, a combined thickness T108$b$+T110$b$ of the second portions 108$b$, 110$b$ of the further insulating layer 108 and the blocking layer 110 may range from about 28 nm to about 58 nm, and may be about 53 nm in a non-limiting embodiment. Note that although the memory region 100$a$ and the logic region 100$b$ are shown in FIG. 1 with a spacing therebetween, it is understood that these regions 100$a$, 100$b$ may contact each other. In other words, each layer 102, 104, 106, 108, 110, 112 may be a continuous layer.

Referring to FIG. 1, in the memory region 100$a$, the first insulating layer 104 may contact the second insulating layer 106; whereas, in the logic region 100$b$, the semiconductor device 100 may further include a stop layer 114 arranged between the first insulating layer 104 and the second insulating layer 106. In other words, the stop layer 114 may be arranged partially between the first insulating layer 104 and the second insulating layer 106. The stop layer 114 may be a polish stop layer and may include a material different from the materials of the first and second insulating layers 104, 106. For example, the stop layer 114 may include polish stop material such as, but not limited to, nitrogen-doped silicon carbide (Nblok). Further, a thickness T114 of the stop layer 114 may range from about 10 nm to about 20 nm, and may in one non-limiting embodiment, be about 15 nm.

As shown in FIG. 1, the semiconductor device 100 may include a first memory structure 116 and a second memory structure 118 arranged within the memory region 100$a$. A height H116, H118 of each memory structure 116, 118 above the further insulating layer 108 may range from about 127 nm to about 137 nm, and may be about 132 nm in a non-limiting embodiment. The protective layer 112 (in particular, the first portion 112$a$ of the protective layer 112) may be arranged over the first and second memory structures 116, 118.

The first memory structure 116 may include a resistance changing memory element $116_1$ within the first insulating layer 104 (in particular, the first portion 104$a$ of the first insulating layer 104). The resistance changing memory element $116_1$ may include any kind of resistance changing memory element as known to those skilled in the art. For example, the resistance changing memory element $116_1$ may include a magnetic tunnel junction (MTJ) element having an insulating film (e.g. an oxide film) between two ferromagnetic layers, where the resistance of the MTJ element may vary based on the magnetization directions of the ferromagnetic layers. Alternatively, the resistance changing memory element $116_1$ may include a resistive random access memory (RRAM) element having an insulating layer between two metal electrodes, where the resistance of the RRAM element may vary based on a voltage difference between the two metal electrodes. The first memory structure 116 may further include a first memory connector $116_2$ arranged under the resistance changing memory element $116_1$ and a second memory connector $116_3$ arranged over the resistance changing memory element $116_1$. The first and second memory connectors $116_2$, $116_3$ may be electrically conductive vias and may include electrically conductive material such as, but not limited to, aluminum, copper, tungsten, alloys thereof, or combinations thereof.

The second memory structure 118 may also include a resistance changing memory element $118_1$ within the first insulating layer 104, a first memory connector $118_2$ arranged under the resistance changing memory element $118_1$ and a second memory connector $118_3$ arranged over the resistance changing memory element $118_1$. The resistance changing memory element $118_1$ and the memory connectors $118_2$, $118_3$ of the second memory structure 118 may be similar to those of the first memory structure 116. In some non-limiting embodiments, the resistance changing memory elements $116_1$, $118_1$ of the first and second memory structures 116, 118 may be of a same type, for example, may be both MTJ elements. However, the resistance changing memory elements $116_1$, $118_1$ of the first and second memory structures 116, 118 may alternatively be of different types.

As shown in FIG. 1, the semiconductor device 100 may also include a first memory contact 120, a second memory contact 122, a third memory contact 124 and a fourth memory contact 126 within the memory region 100$a$. The memory contacts 120, 122, 124, 126 may include electrically conductive material, such as, but not limited to, aluminum, copper, tungsten, alloys thereof, or combinations thereof. The first and third memory contacts 120, 124 may be arranged at least partially within the base layer 102. The blocking layer 110 may serve as a diffusion barrier to reduce metal diffusion from the first and third memory contacts 120, 124 to the further insulating layer 108. The second and fourth memory contacts 122, 126 may extend through at least the second insulating layer 106. For example, as shown in FIG. 1, the second and fourth memory contacts 122, 126 may extend through both the first and second insulating layers 104, 106. However, in some non-limiting embodiments, the second and fourth memory contacts 122, 126 may extend through only the second insulating layer 106.

The first memory structure 116 may electrically contact the first memory contact 120 and the second memory contact 122; whereas, the second memory structure 118 may electrically contact the third memory contact 124 and the fourth memory contact 126. In particular, the first memory connectors $116_2$, $118_2$ of the first and second memory structures 116, 118 may extend through the further insulating layer 108 and the blocking layer 110 (the first portions 108$a$, 110$a$ of these layers 108, 110) to electrically contact the first and third memory contacts 120, 124, respectively. The second memory contact 122 and the fourth memory contact 126 may be arranged over the second memory connectors $116_3$, $118_3$ of the first and second memory structures 116, 118, respectively. In particular, these memory contacts 122, 126 may be arranged over and may contact the protective layer 112. The protective layer 112 may be electrically conductive and accordingly, the second memory contact 122 may electrically contact the second memory connector $116_3$ of the first memory structure 116; whereas, the fourth memory contact 126 may electrically contact the second memory connector $118_3$ of the second memory structure 118.

As shown in FIG. 1, the semiconductor device 100 may further include a logic structure 128 arranged within the logic region 100$b$. The semiconductor device 100 may also include a first logic contact 130, a second logic contact 132 and a third logic contact 134. The logic structure 128 and the first, second and third logic contacts 130, 132, 134 may each include electrically conductive material, such as, but not limited to aluminum, copper, tungsten, alloys thereof, or combinations thereof. The first logic contact 130 may be arranged under the logic structure 128 and the second logic contact 132 may be arranged over the logic structure 128. In other words, the logic structure 128 may be an electrically conductive via arranged to electrically connect the first and second logic contacts 130, 132. The first and third logic contacts 130, 134 may be arranged at least partially within the base layer 102 (in particular, within the second portion 102$b$ of the base layer 102). Similarly, the blocking layer 110 may serve as a diffusion barrier to reduce metal diffusion from the first and third logic contacts 130, 134 to the further insulating layer 108. The second logic contact 132 may extend through at least the second insulating layer 106. For example, as shown in FIG. 1, the second logic contact 132 may extend through the second insulating layer 106, the stop layer 114 and the first insulating layer 104 to contact the logic structure 128. However, depending on a height of the logic structure 128, the second logic contact 132 may alternatively extend through only the second insulating layer 106 or only the second insulating layer 106 and the stop layer 114.

Note that although only two memory structures 116, 118 and four memory contacts 120, 122, 124, 126 are shown in FIG. 1, it is understood that there may be fewer (only one) memory structure or more than two memory structures and there may be fewer or more memory contacts in the semiconductor device 100. Similarly, although only one logic structure 128 and three logic contacts 130, 132, 134 are depicted in FIG. 1, the number of logic structures and logic contacts may alternatively be different.

FIGS. 2A to 2E show simplified cross-sectional views illustrating a method for fabricating the semiconductor device 100 according to various non-limiting embodiments. For clarity of illustration, some reference numerals have been omitted from FIGS. 2A to 2E.

Figure 2A:
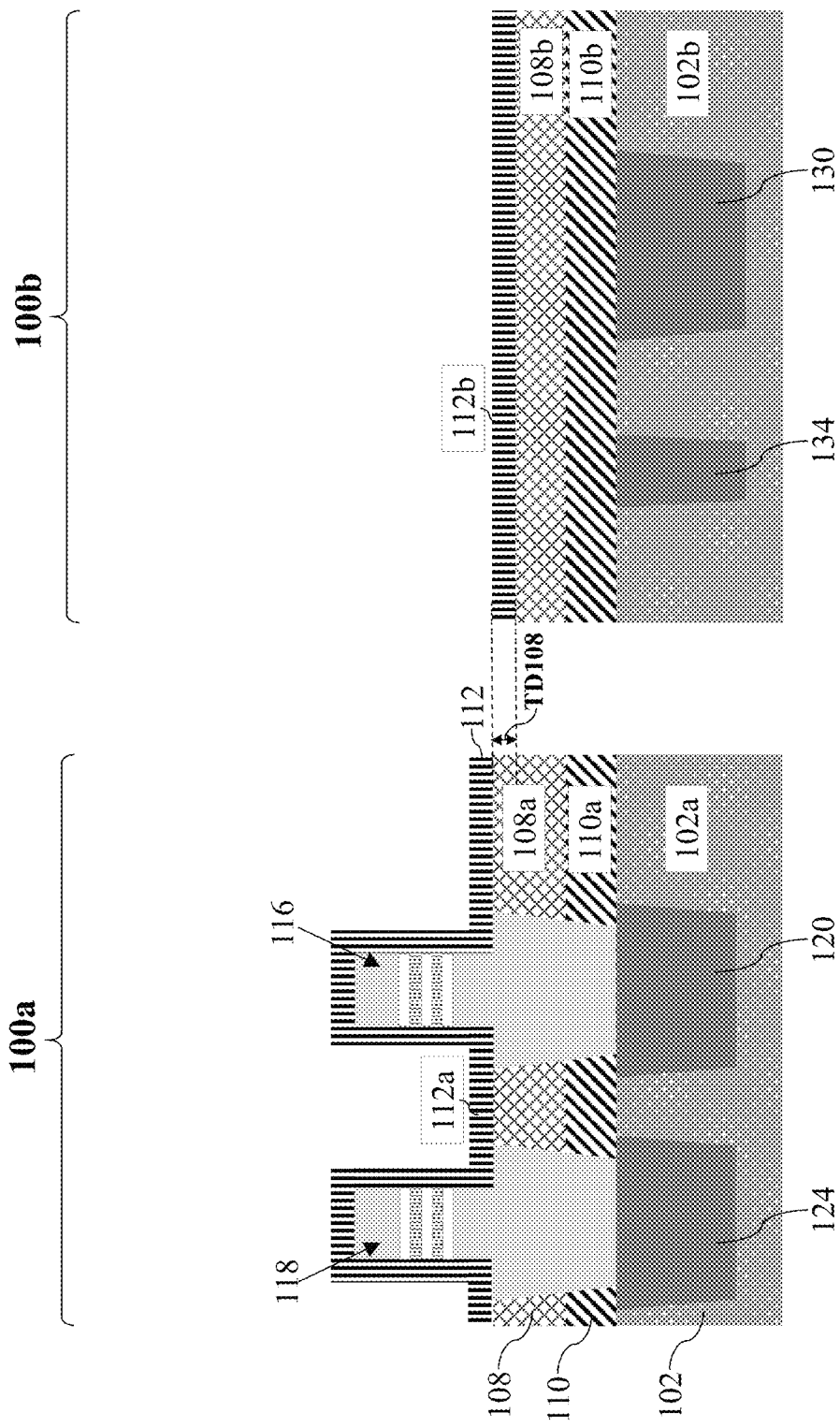
FIGS. 2A to 2E show simplified cross-sectional views illustrating a method of forming the semiconductor device of FIG. 1 according to various non-limiting embodiments.

Referring to FIG. 2A, the method may include forming the base layer 102. The method may further include forming the first and third memory contacts 120, 124, and the first and third logic contacts 130, 134 at least partially within the base layer 102. The blocking layer 110 may be formed over the base layer 102 and the further insulating layer 108 may be formed over the blocking layer 110. The first memory structure 116 and the second memory structure 118 may then be formed within the memory region 100a using any method as known to those skilled in the art. As shown in FIG. 2A, the first memory structure 116 and the second memory structure 118 may be formed to contact the first memory contact 120 and the third memory contact 124, respectively. During fabrication of the memory structures 116, 118, a larger amount of material may be removed from the further insulating layer 108 in the logic region 100b than in the memory region 100a and hence, the first portion 108a of the further insulating layer 108 may be thicker than the second portion 108b of the further insulating layer 108. As shown in FIG. 2A, the protective layer 112 may then be formed over the memory structures 116, 118 and the further insulating layer 108.

Figure 2B:
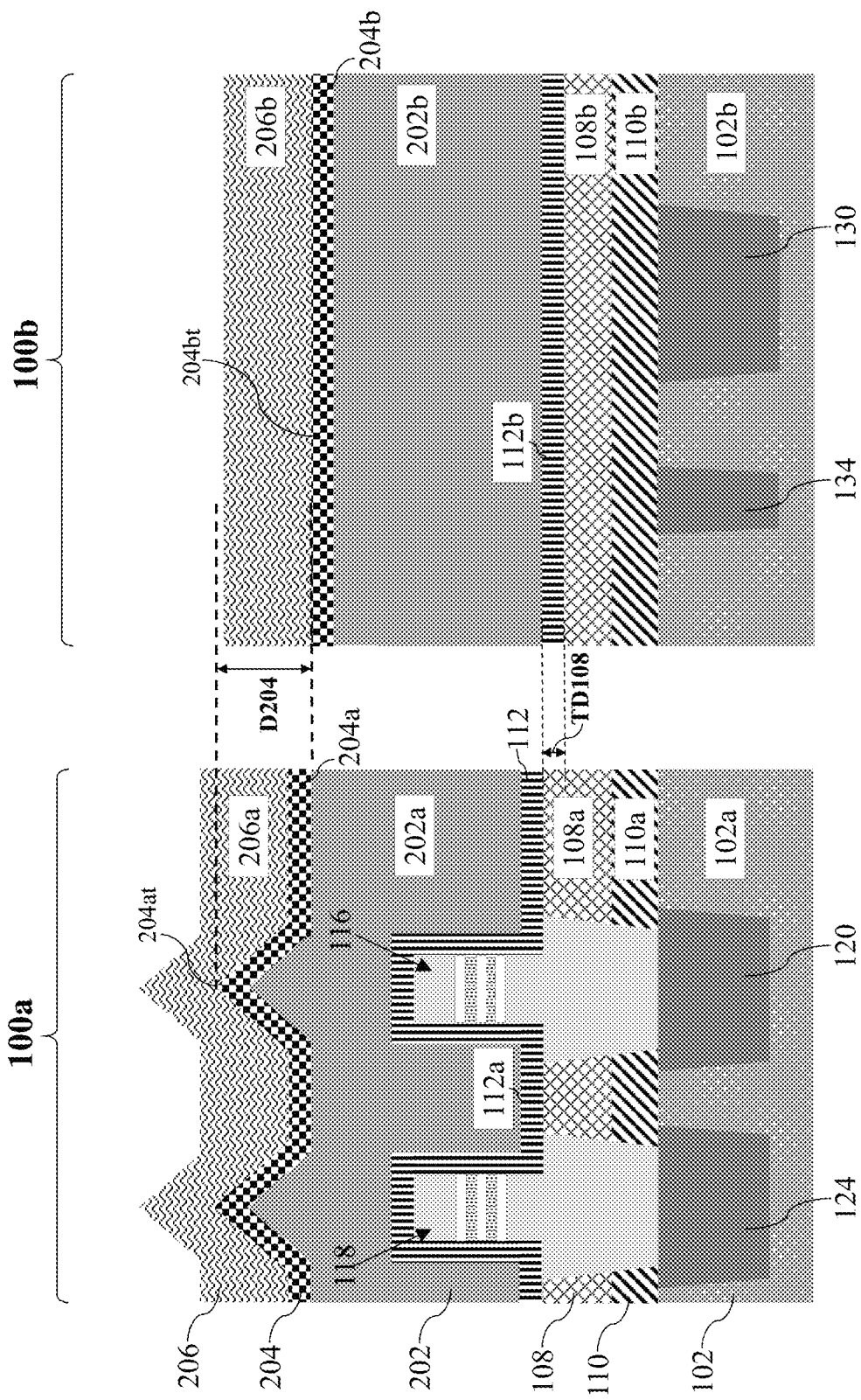
Figure 2C:
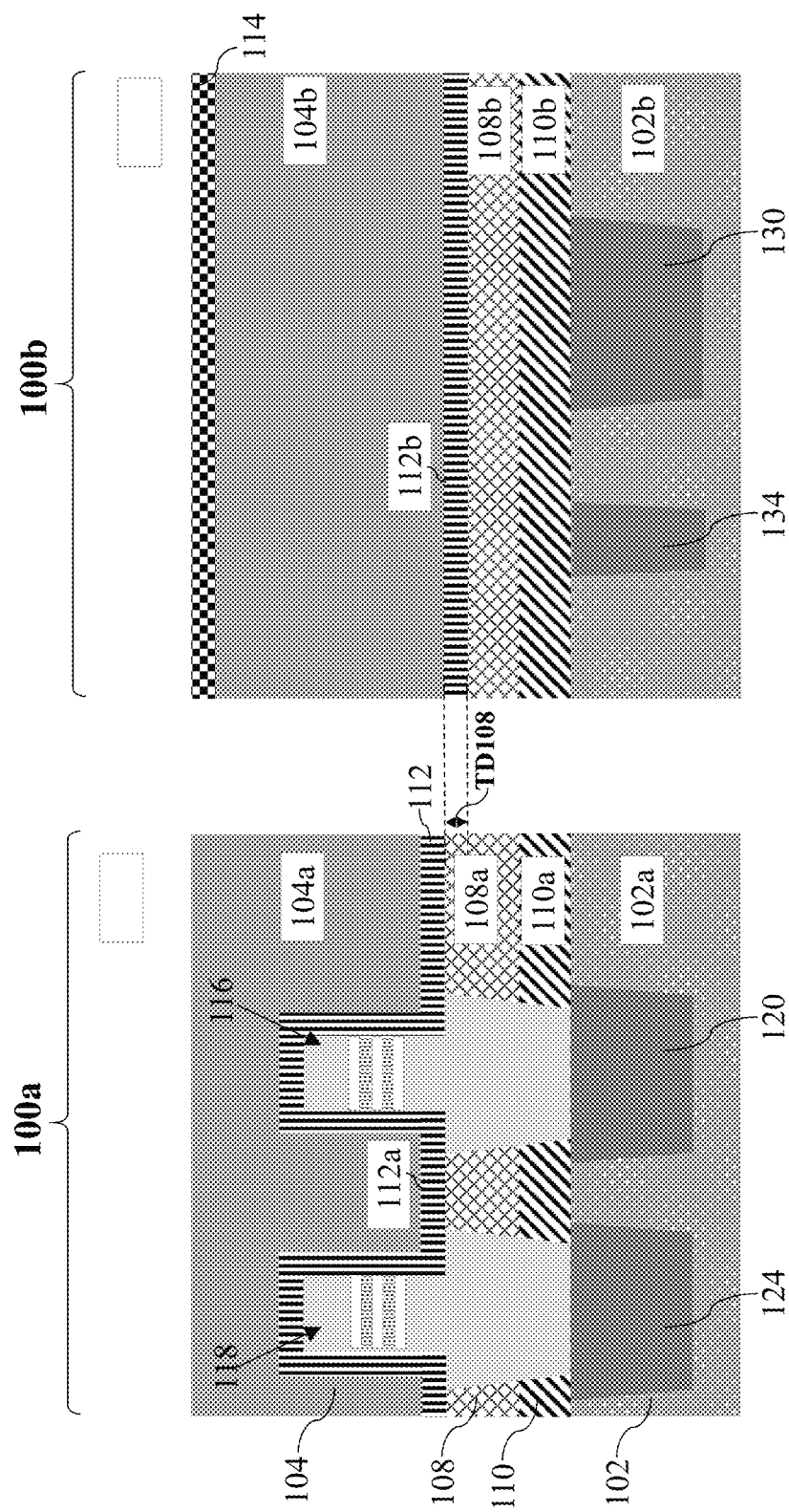

Referring to FIGS. 2B and 2C, the method may further include forming the first insulating layer 104 over the memory structures 116, 118 (in other words, over the further insulating layer 108) and forming the stop layer 114 partially over the first insulating layer 104.

In particular, as shown in FIG. 2B, the method may include forming an intermediate insulating layer 202 over the memory structures 116, 118 and the protective layer 112, where the intermediate insulating layer 202 may have a first portion 202a in the memory region 100a and a second portion 202b in the logic region 100b. Further, an intermediate stop layer 204 may be formed over the intermediate insulating layer 202. The intermediate stop layer 204 may similarly have a first portion 204a in the memory region 100a and a second portion 204b in the logic region 100b. A further intermediate insulating layer 206 may then be formed over the intermediate stop layer 204, where the further intermediate insulating layer 206 may also have a first portion 206a in the memory region 100a and a second portion 206b in the logic region 100b. The further intermediate insulating layer 206 may include insulating material similar to the material of the intermediate insulating layer 202.

Due to the presence of the memory structures 116, 118 in the memory region 100a, the first portion 202a of the intermediate insulating layer 202 may have a greater surface topology as compared to the second portion 202b of the intermediate insulating layer 202. Accordingly, the first portions 204a, 206a of the intermediate stop layer 204 and the further intermediate insulating layer 206 may each have a greater surface topology than the respective second portions 204b, 206b. In this document, by "surface topology of a layer/portion", it is meant a distance between a highest point of the surface of the layer/portion and a lowest point of the surface of the layer/portion and the larger this distance, the greater the surface topology of the layer/portion. As shown in FIG. 2B, a step height D204 between a highest point 204at of the top surface of the intermediate stop layer's 204 first portion 204a and a top surface 204bt of the intermediate stop layer's 204 second portion 204b may range from about 159 nm to about 169 nm, and may be about 164 nm in a non-limiting embodiment.

As shown in FIG. 2C, the method may further include removing the first portion 204a of the intermediate stop layer 204 and a part of the first portion 202a of the intermediate insulating layer 202. Both the first and second portions 206a, 206b of the further intermediate insulating layer 206 may also be removed. In some non-limiting embodiments, this may be carried out using a polishing technique such as, but not limited to a chemical mechanical polishing (CMP) technique. Due to the greater surface topology of the first portions 202a, 204a, 206a of the intermediate insulating layers 202, 206 and the intermediate stop layer 204, these first portions 202a, 204a, 206a may be more easily removed by the polishing technique as compared to the respective second portions 202b, 204b, 206b. The polishing may thus continue until the top of the second portion 204b of the intermediate stop layer 204. Due to the difference TD108 in the thicknesses of the first and second portions 108a, 108b of the further insulating layer 108, the first portion 204a of the intermediate stop layer 204 may be at a higher level (in other words, further away from the base layer 102) as compared to the second portion 204b of the intermediate stop layer 204. Accordingly, when the polishing stops at the top of the second portion 204b of the intermediate stop layer 204, the first portion 204a of the intermediate stop layer 204, together with at least a part of the surface topology of the intermediate insulating layer's 202 first portion 202a, may be removed. On the other hand, the second portion 202b of the intermediate insulating layer 202 may remain relatively intact under the second portion 204b of the intermediate stop layer 204. The remaining first and second portions 202a, 202b of the intermediate insulating layer 202 may thus form the first and second portions 104a, 104b of the first insulating layer 104, respectively. In addition, the second portion 204b of the intermediate stop layer 204 may form the stop layer 114.

Figure 2D:
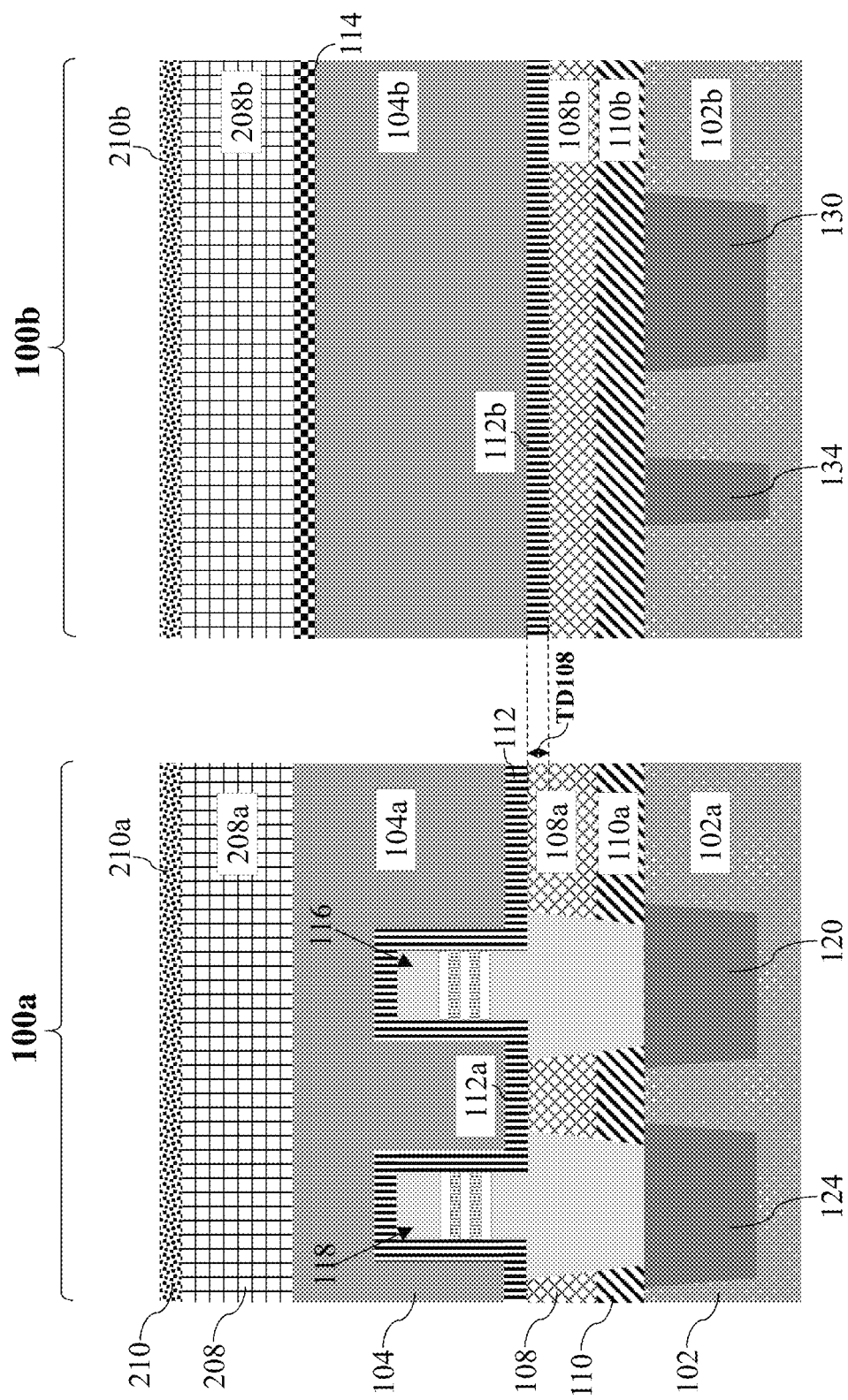
Figure 2E:
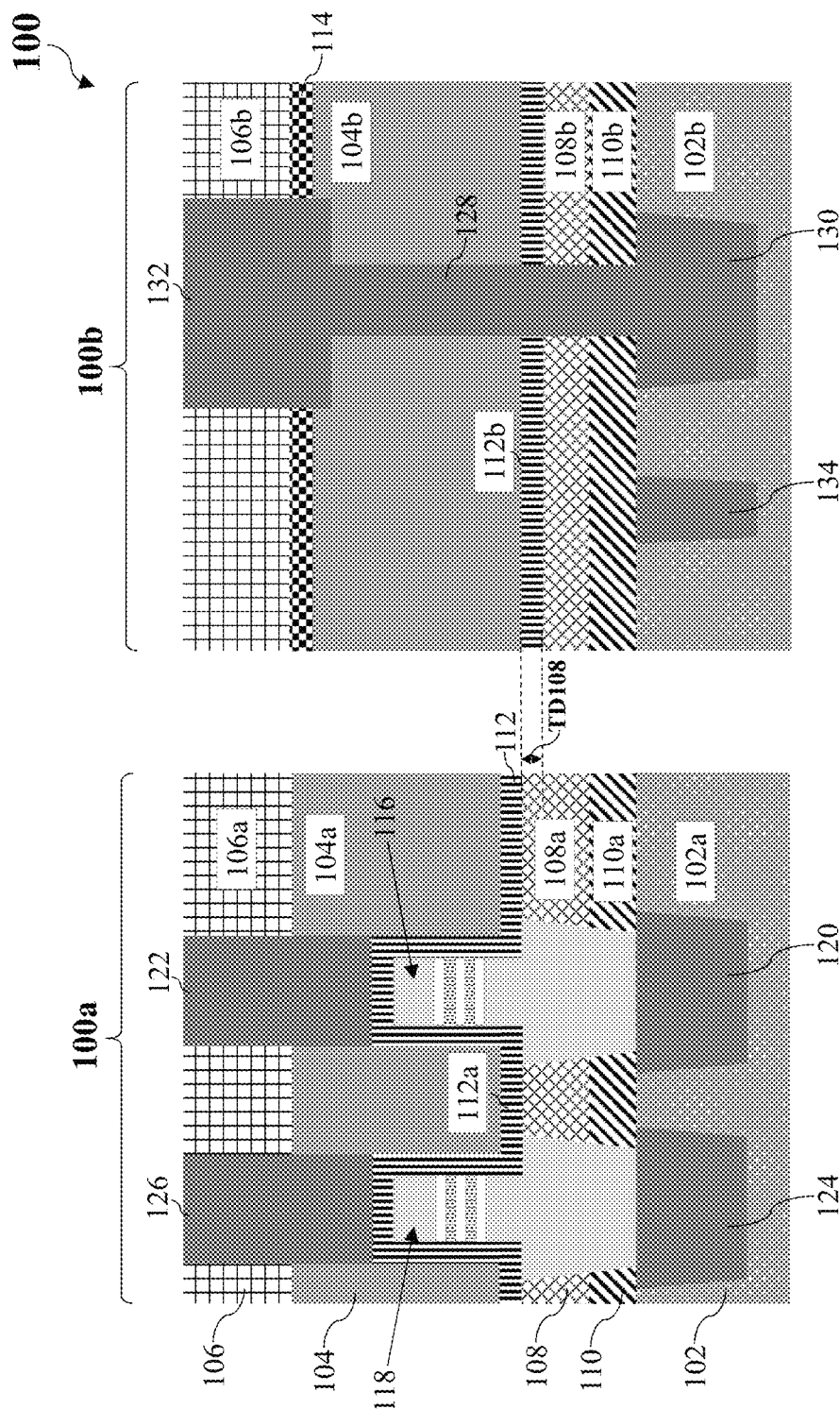

Referring to FIGS. 2D and 2E, the method may further include forming the second insulating layer 106 over the first insulating layer 104 and the stop layer 114, forming the logic structure 128 within the logic region 100b, and forming the second and fourth memory contacts 122, 126 and the second logic contact 132.

As shown in FIG. 2D, the method may include forming another intermediate insulating layer 208 over the first insulating layer 104 and the stop layer 114. Further, a mask layer 210 may be formed over this intermediate insulating layer 208. Each of the intermediate insulating layer 208 and the mask layer 210 may include a first portion 208a, 210a in the memory region 100a and a second portion 208b, 210b in the logic region 100b. The mask layer 210 may be a hard mask layer and may include mask/insulating material such as, but not limited to, tetraethyl orthosilicate (TEOS).

As shown in FIG. 2E, the method may further include removing parts of the first insulating layer 104 and parts of the intermediate insulating layer 208 to form openings/trenches. This may be carried out using any method as known to those skilled in the art. For example, a photoresist mask may be formed over the mask layer 210 and the mask layer 210 may be etched using the photoresist mask. The first insulating layer 104 and the intermediate insulating layer 208 may then be etched to form the openings/trenches using the etched mask layer 210. The openings/trenches may then be filled with conductive material to form the logic structure 128, the memory contacts 122, 126 and the logic contact 132. The remaining intermediate insulating layer 208 may form the second insulating layer 106 and the mask layer 210 may be removed.

The above described order for the method is only intended to be illustrative, and the method is not limited to the above specifically described order unless otherwise specifically stated.

As described above, by using an intermediate stop layer 204 when fabricating the semiconductor device 100, the surface topology of the intermediate insulating layer 202 in the memory region 100a may be reduced using a polishing technique. As compared to reducing the surface topology using an etch back process, using the polishing technique may result in less damage to the intermediate insulating layer 202 (and hence, less damage to the eventual first insulating layer 104). Thus, the likelihood of delamination between the first and second insulating layers 104, 106 at the memory region 100a may be reduced. Further, it may be easier to achieve a specific thickness of the first insulating layer 104 using the polishing technique as compared to using the etch back process. In addition, the stop layer 114 between the first and second insulating layers 104, 106 in the logic region 100b may help to improve the uniformity in the depth of the trenches used for forming the logic structure 128 and the second logic contact 132. Accordingly, the semiconductor device 100 may have increased reliability.

Figure 3:
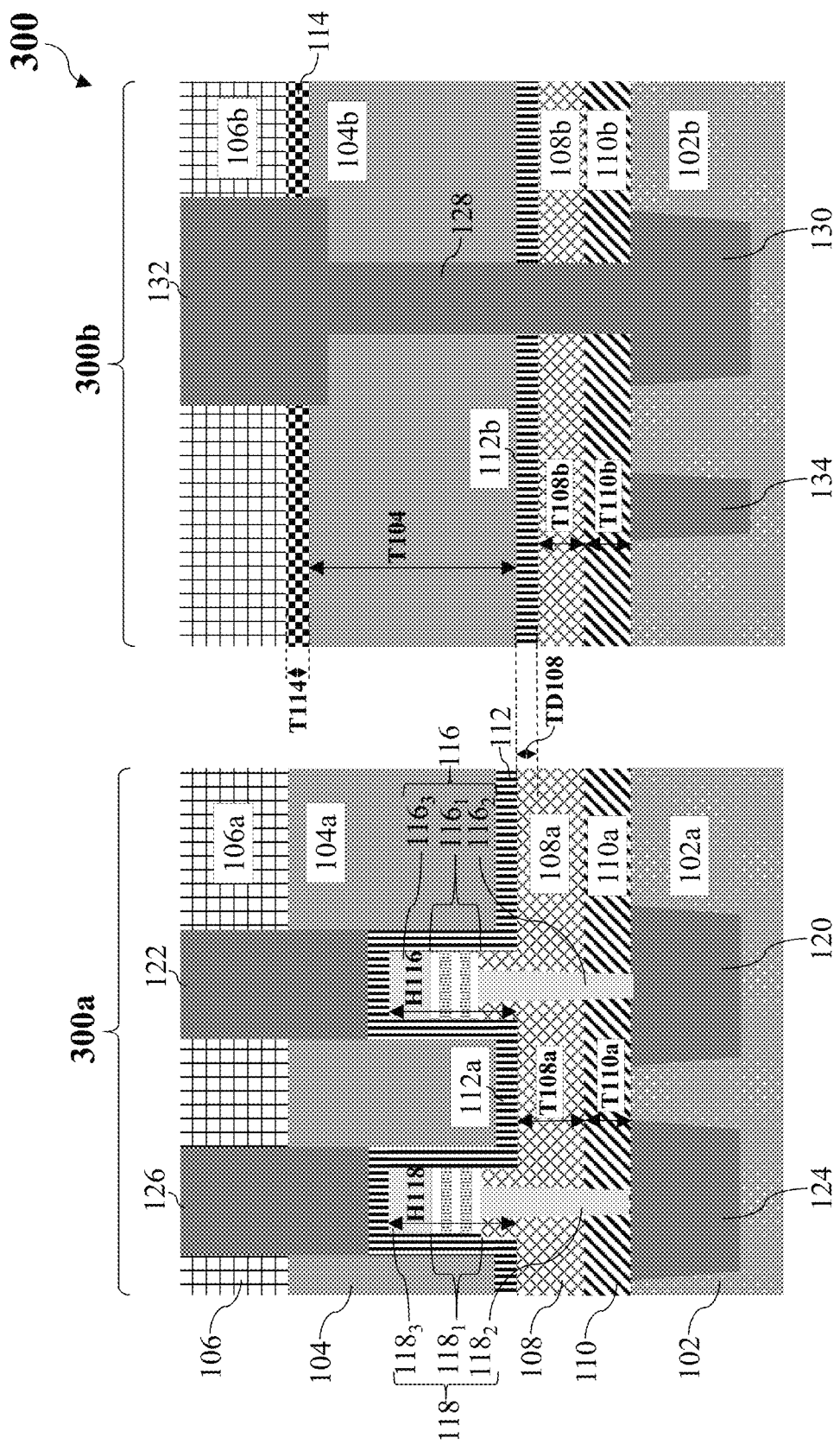
FIG. 3 shows a simplified cross-sectional view of a semiconductor device according to alternative non-limiting embodiments.

FIG. 3 shows a semiconductor device 300 according to alternative non-limiting embodiments. The semiconductor device 300 may include a memory region 300a and a logic region 300b similar to the memory region 100a and the logic region 100b of the semiconductor device 100, and thus, the common features are labelled with the same reference numerals and need not be discussed.

As shown in FIG. 3, the first memory connectors 116$_2$, 118$_2$ of the memory structures 116, 118 in the semiconductor device 300 may be of a different shape from those in the semiconductor device 100. In particular, in the semiconductor device 100, each of the first memory connectors 116$_2$, 118$_2$ may include a wider base portion and a narrower top portion, where a width of the narrower top portion may be approximately equal to a width of the respective second memory connector 116$_3$, 118$_3$. On the other hand, in the semiconductor device 300, each first memory connector 116$_2$, 118$_2$ may have an approximately constant width throughout its length, where this width may be smaller than the width of the respective second memory connector 116$_3$, 118$_3$. The semiconductor device 300 may be fabricated using a method similar to the method for fabricating the semiconductor device 100, as described above with reference to FIGS. 2A to 2E.

Figure 4:
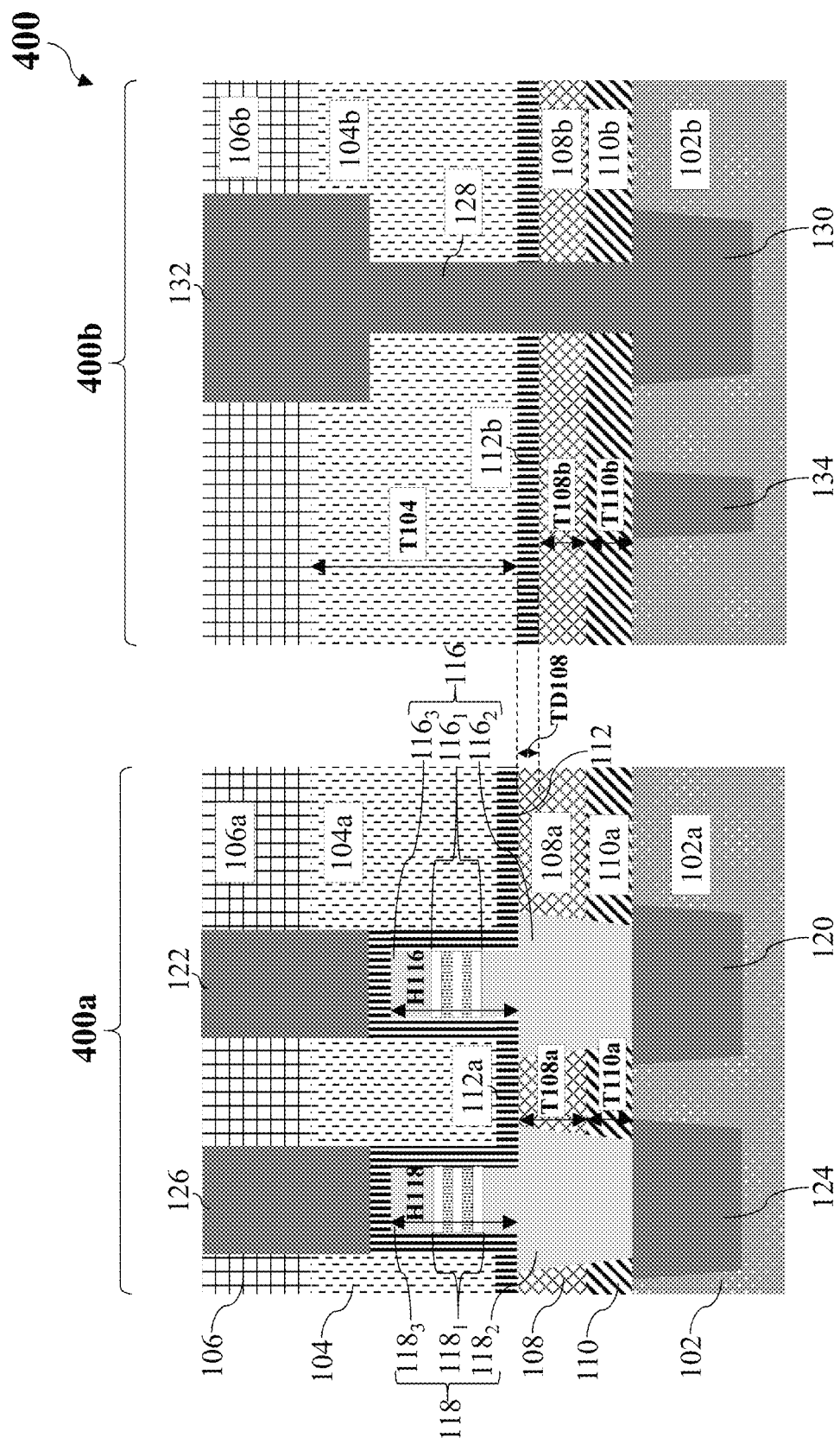
FIG. 4 shows a simplified cross-sectional view of a semiconductor device according to alternative non-limiting embodiments.

FIG. 4 shows a semiconductor device 400 according to alternative non-limiting embodiments. The semiconductor device 400 may include a memory region 400a and a logic region 400b similar to the memory region 100a and the logic region 100b of the semiconductor device 100, and thus, the common features are labelled with the same reference numerals and need not be discussed.

As shown in FIG. 4, unlike the semiconductor device 100, the stop layer 114 may be absent in the semiconductor device 400. Accordingly, the first insulating layer 104 may contact the second insulating layer 106 in both the memory region 100a and the logic region 100b. In other words, the first portion 104a of the first insulating layer 104 may contact the first portion 106a of the second insulating layer 106; whereas, the second portion 104b of the first insulating layer 104 may contact the second portion 106b of the second insulating layer 106. Further, the first insulating layer 104 and the second insulating layer 106 may be formed of different materials. In particular, the first insulating layer 104 may be formed of a first material and the second insulating layer 106 may be formed of a second material, and a surface topology of the first material may be lower than a surface topology of the second material. For example, the first insulating layer 104 may be a spin-on-glass (SOG) layer; whereas, the second insulating layer 106 may be a SiCOH layer. However, the first and second insulating layers 104, 106 may include any other materials known to those skilled in the art.

FIGS. 5A to 5E show simplified cross-sectional views illustrating a method for fabricating the semiconductor device 400 according to various non-limiting embodiments. For clarity of illustration, some reference numerals have been omitted from FIGS. 5A to 5E.

Figure 5A:
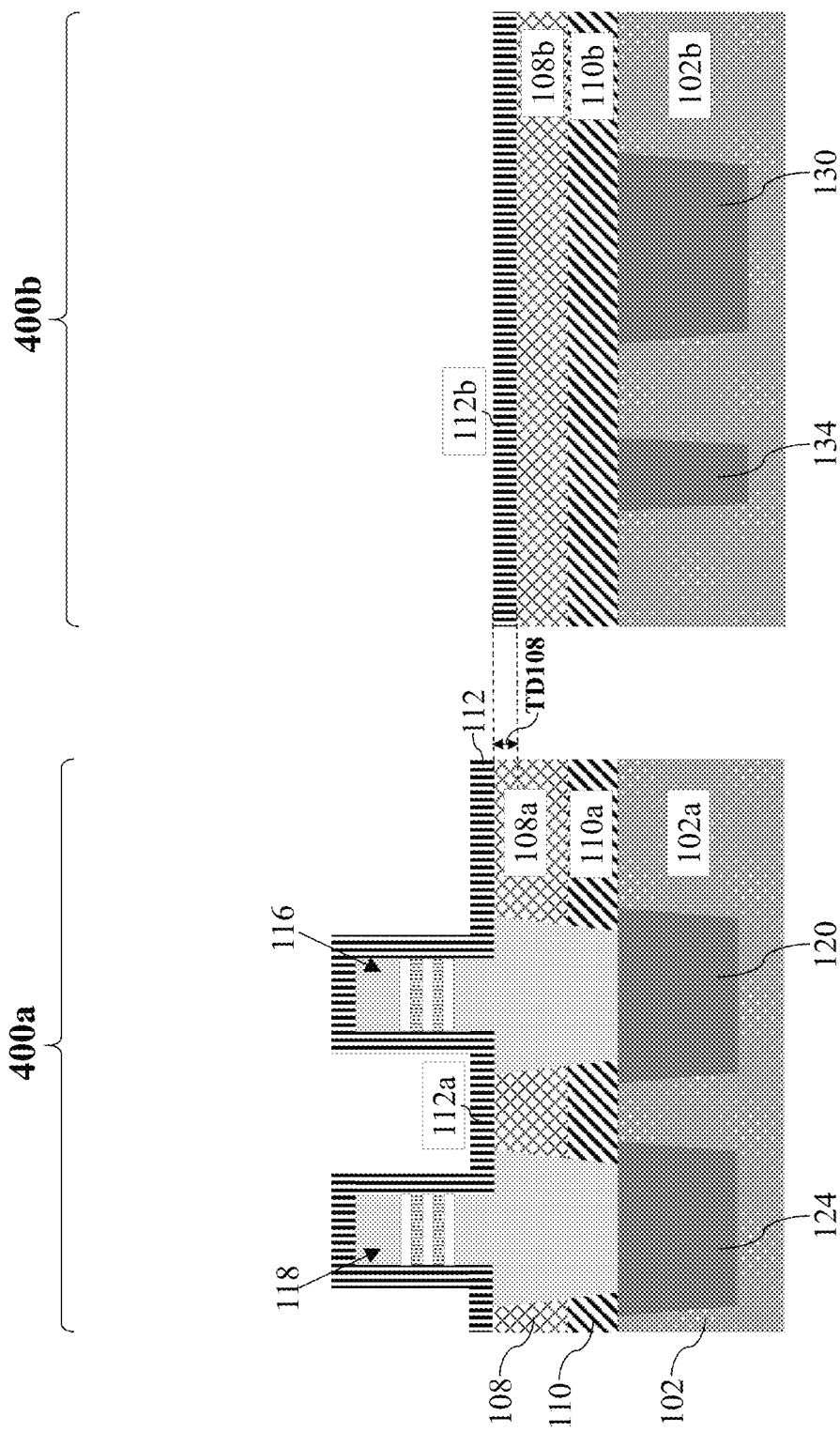
FIGS. 5A to 5E show simplified cross-sectional views illustrating a method of forming the semiconductor device of FIG. 4 according to various non-limiting embodiments.

Referring to FIG. 5A, the method may include forming the base layer 102, the blocking layer 110, the further insulating layer 108, the memory structures 116, 118, the protective layer 112 and the contacts 120, 124, 130, 134 in a manner similar to that described above with reference to FIG. 2A.

Figure 5B:
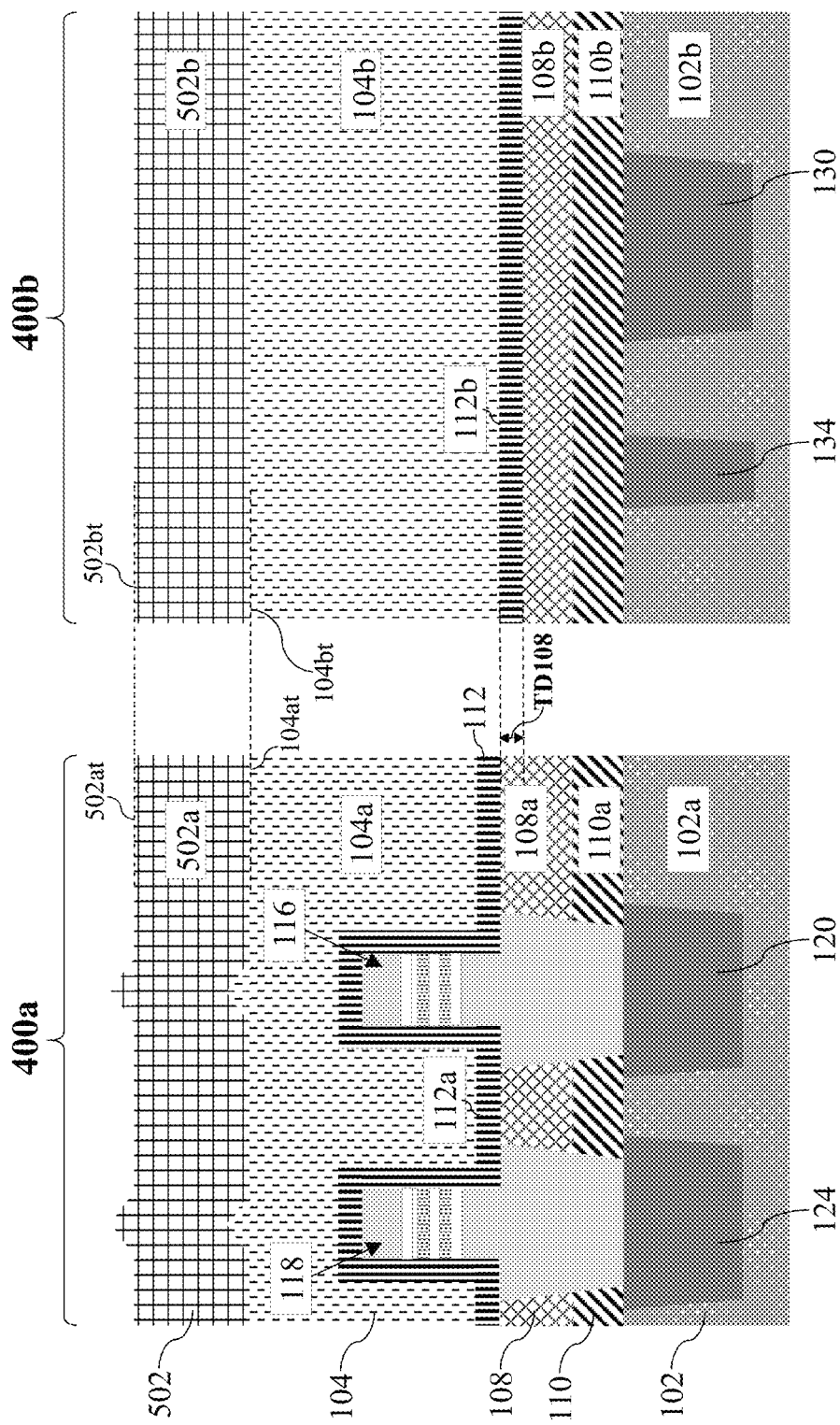

Referring to FIG. 5B, the method may further include forming the first insulating layer 104 over the memory structures 116, 118 (in other words, over the further insulating layer 108). This may be done by depositing insulating material over the protective layer 112. As shown in FIG. 5B, this deposition may be performed in a manner such that the top surfaces 104at, 104bt of the first and second portions 104a, 104b of the resulting first insulating layer 104 may be substantially horizontally aligned. As mentioned above, the first insulating layer 104 (including the first and second portions 104a, 104b) may be formed of spin-on-glass (SOG) material. The use of such material may allow the top surfaces 104at, 104bt of the first and second portions 104a, 104b to be substantially horizontally aligned after the above-mentioned deposition. The first insulating layer 104 may alternatively be formed of other similar material that may allow the top surfaces 104at, 104bt of the first and second portions 104a, 104b to be substantially horizontally aligned after the above-mentioned deposition. Further, the method may include forming an intermediate insulating layer 502 over the first insulating layer 104. The intermediate insulating layer 502 may include a first portion 502a in the memory region 400a and a second portion 502b in the logic region 400b. As shown in FIG. 5B, the top surfaces 502at, 502bt of the first and second portions 502a, 502b of the intermediate insulating layer 502 may also be substantially horizontally aligned. The surface topologies of the first portions 104a, 502a of the layers 104, 502 may be slightly greater than the surface topologies of the respective second portions 104b, 502b of these layers 104, 502 (particularly at regions over the memory structures 116, 118). However, due to the lower surface topology of the material used for the first insulating layer 104 in FIG. 5B, the difference in the surface topologies of the first and second portions 104a, 104b of the first insulating layer 104 in FIG. 5B may be less than the difference in the surface topologies of the first and second portions 202a, 202b of the intermediate insulating layer 202 in FIG. 2B.

Figure 5C:
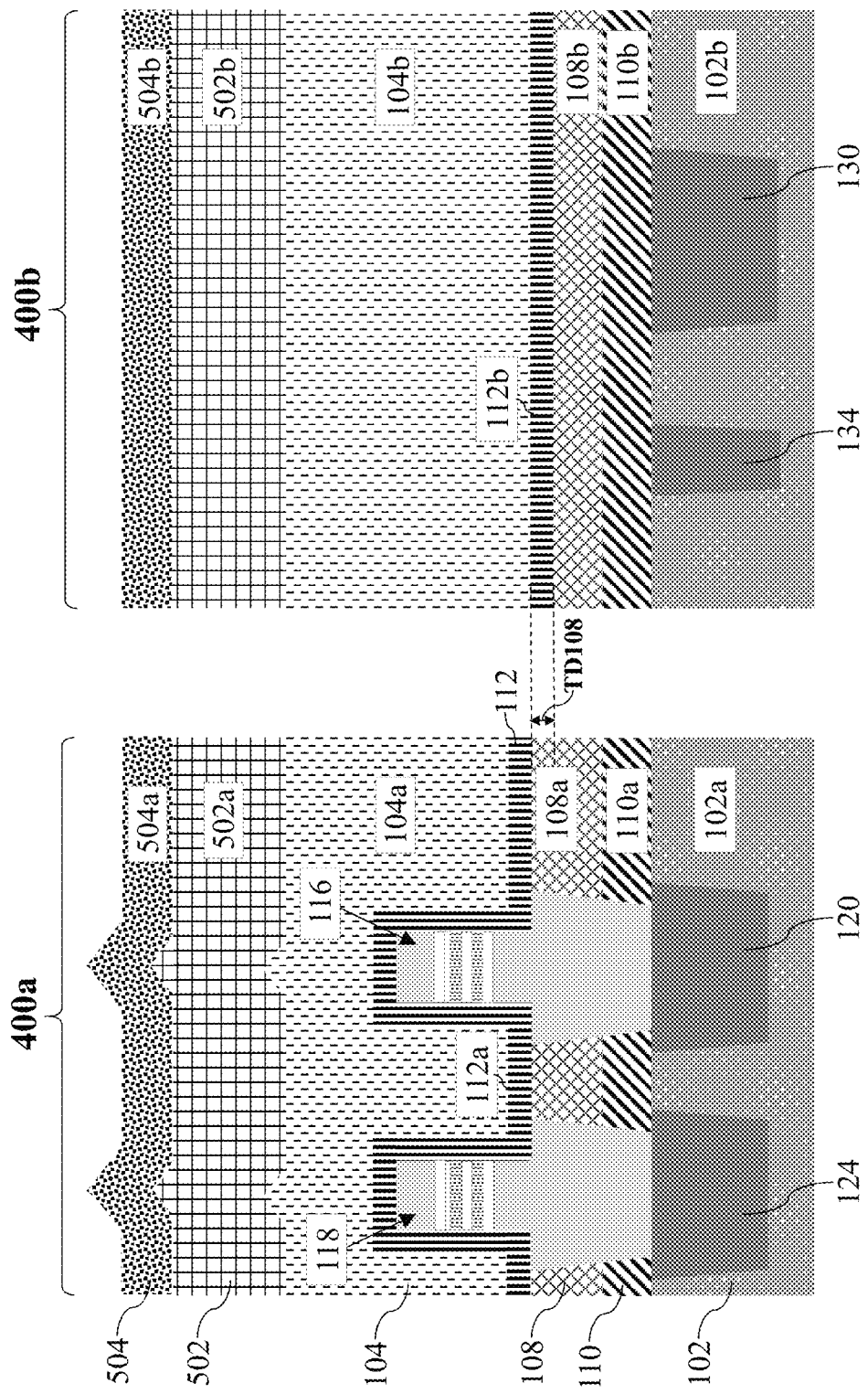

Referring to FIG. 5C, the method may include forming a mask layer 504 over the intermediate insulating layer 502. The mask layer 504 may also include a first portion 504a in the memory region 400a and a second portion 504b in the logic region 400b. As mentioned above, in the intermediate insulating layer 502, the surface topology of the first portion 502a may be slightly greater than the surface topology of the second portion 502b. Accordingly, the surface topology of the first portion 504a of the mask layer 504 may also be slightly greater than the surface topology of the second portion 504b of the mask layer 504 since the mask layer 504 may be formed over the intermediate insulating layer 502. In other words, the surface topology of the first portion 502a of the intermediate insulating layer 502 may be transferred to the first portion 504a of the mask layer 504. The mask layer 504 may be a hard mask layer and may include mask/insulating material such as, but not limited to, tetraethyl orthosilicate (TEOS).

Figure 5D:
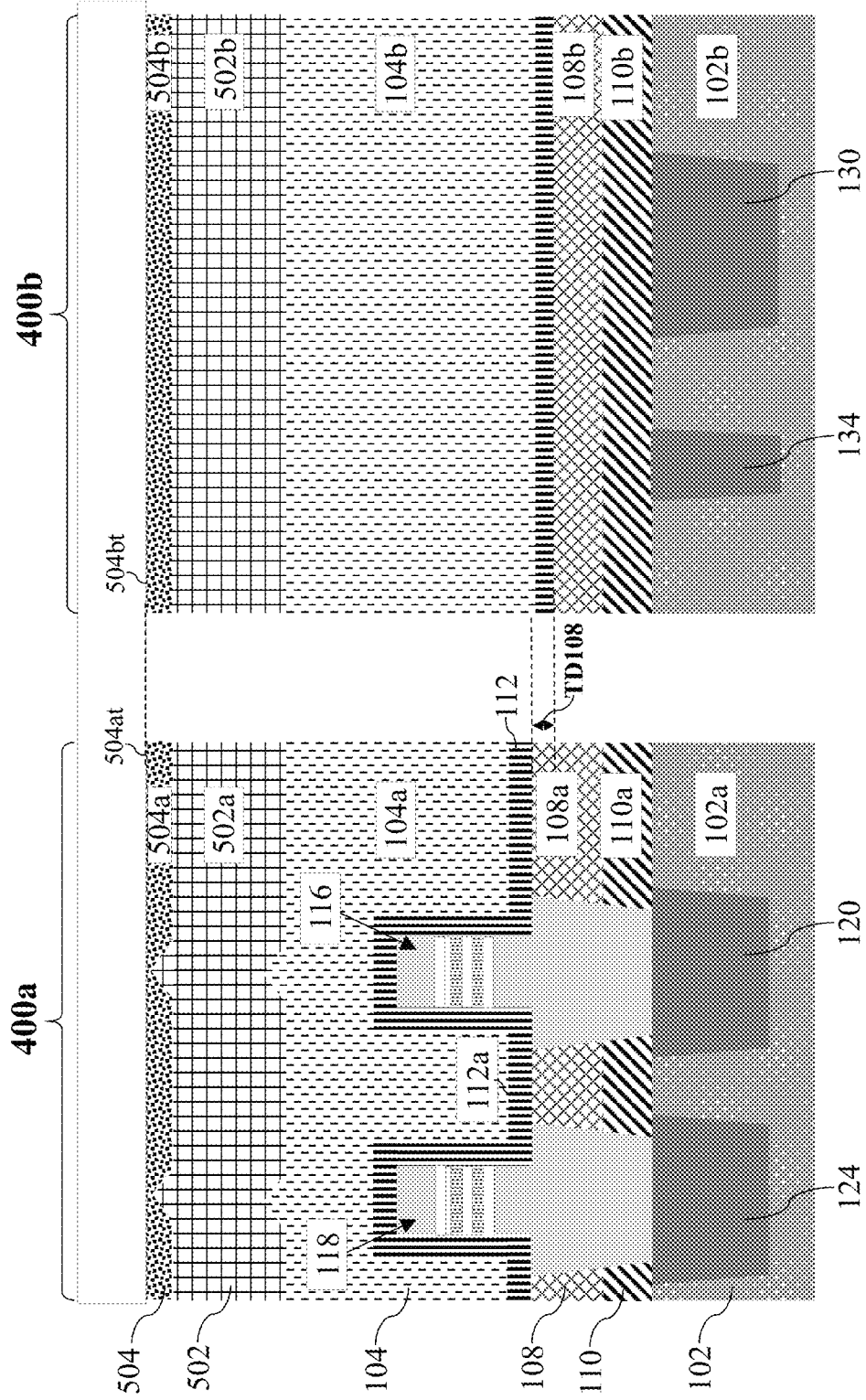

Referring to FIG. 5D, the method may include removing a top part of the mask layer 504 such that a top surface 504at of the first portion 504a of the mask layer 504 may be substantially horizontally aligned with a top surface 504bt of the second portion 504b of the mask layer 504. This may be carried out using a polishing technique such as, but not limited to, a chemical mechanical polishing (CMP) technique. In FIG. 5D, it is shown that only the top part of the first portion 504a of the mask layer 504 is removed. However, in some non-limiting embodiments, a top part of the intermediate insulating layer 502 may also be removed and this may help to reduce the surface topology of the resulting second insulating layer 106.

Figure 5E:
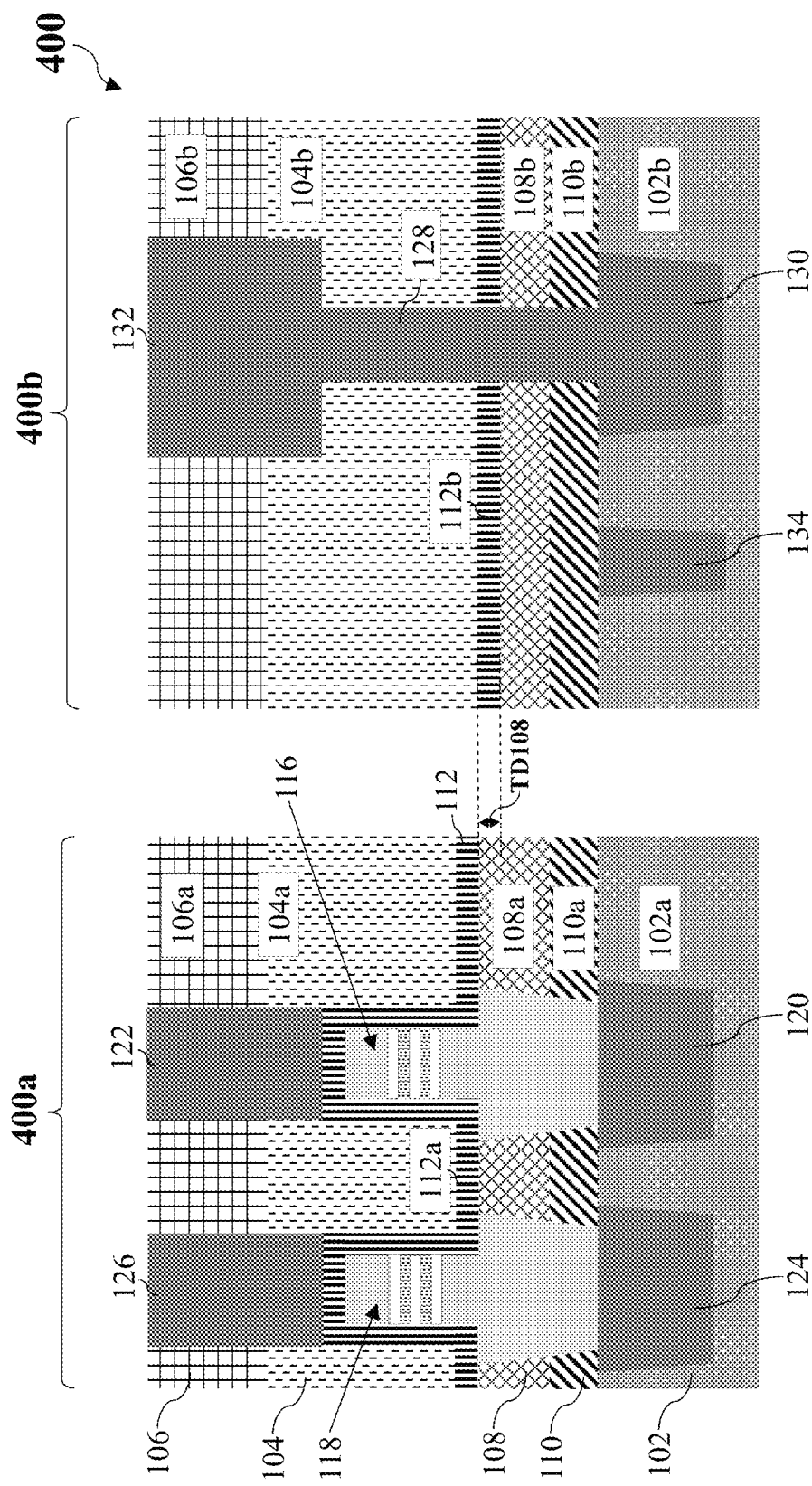

Referring to FIG. 5E, the method may include forming the logic structure 128, the memory contacts 122, 126 and the logic contact 132 in a manner similar to that described above with respect to FIG. 2E. The remaining intermediate insulating layer 502 may form the second insulating layer 106 and the mask layer 504 may be removed.

By using a material with a lower surface topology for the first insulating layer 104, it may be possible to fabricate a sufficiently reliable semiconductor device 400 without an additional process of reducing the surface topology of the material over the memory structures 116, 118. In other words, the etch back process typically performed to reduce the surface topology of the first insulating layer 104 may be omitted. Since such an etch back process tends to cause damage to the semiconductor device, omitting it can help obtain a more reliable semiconductor device 400.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. A semiconductor device comprising:
a first insulating layer;
a second insulating layer arranged over the first insulating layer;
a further insulating layer under the first insulating layer;
a base layer under the further insulating layer;
a memory structure arranged within a memory region and comprising a resistance changing memory element within the first insulating layer; and
a logic structure arranged within a logic region;
wherein in the memory region, the first insulating layer contacts the second insulating layer and wherein in the logic region, the semiconductor device further comprises a stop layer arranged between the first insulating layer and the second insulating layer,
wherein a top surface of the first insulating layer that contacts the second insulating layer in the memory region and a top surface of the stop layer that contacts the second insulating layer in the logic region are each the same distance away from a top surface of the base layer.

2. The semiconductor device of claim 1, wherein the first insulating layer and the second insulating layer are formed of different materials.

3. The semiconductor device of claim 1, wherein the first insulating layer and the second insulating layer are formed of a same material.

4. The semiconductor device of claim 1, further comprising a protective layer arranged over the memory structure, wherein the protective layer comprises a first portion within the memory region and a second portion within the logic region.

5. The semiconductor device of claim 1, wherein the further insulating layer comprises a first portion in the memory region and a second portion in the logic region, and wherein a thickness of the first portion of the further insulating layer is greater than a thickness of the second portion of the further insulating layer.

6. The semiconductor device of claim 5, wherein the further insulating layer and the first insulating layer are formed of different materials.

7. The semiconductor device of claim 6, wherein a dielectric constant of the further insulating layer is lower than a dielectric constant of the first insulating layer.

8. The semiconductor device of claim 5, further comprising a first memory contact arranged at least partially within the base layer in the memory region, wherein the memory structure electrically contacts the first memory contact.

9. The semiconductor device of claim 8, further comprising a blocking layer arranged between the base layer and the further insulating layer.

10. The semiconductor device of claim 8, wherein the memory structure further comprises a first memory connector arranged under the resistance changing memory element and extending through the further insulating layer to electrically contact the first memory contact.

11. The semiconductor device of claim 10, wherein the memory structure further comprises a second memory connector arranged over the resistance changing memory element, and wherein the semiconductor device further comprises a second memory contact arranged over and electrically contacting the second memory connector.

12. The semiconductor device of claim 1, further comprising:
a first logic contact and a second logic contact arranged within a logic region,
wherein each of the logic structure, the first logic contact and the second logic contact includes electrically conductive material,
wherein the first logic contact is arranged under the logic structure and at least partially within the base layer, the second logic contact is arranged over the logic structure, and the logic structure electrically connects the first logic contact and the second logic contact.

13. A method for fabricating a semiconductor device, the method comprising:
forming a memory structure within a memory region;
forming a first insulating layer over the memory structure, wherein the memory structure comprises a resistance changing memory element within the first insulating layer;
forming a stop layer partially over the first insulating layer;
forming a second insulating layer over the first insulating layer;
forming a further insulating layer under the first insulating layer;
forming a base layer under the further insulating layer; and
forming a logic structure within a logic region;
wherein in the memory region, the first insulating layer contacts the second insulating layer and wherein in the logic region, the stop layer is arranged between the first insulating layer and the second insulating layer
wherein a top surface of the first insulating layer that contacts the second insulating layer in the memory region and a top surface of the stop layer that contacts the second insulating layer in the logic region are each the same distance away from a top surface of the base layer.

14. The method of claim 13, wherein forming the first insulating layer and the stop layer further comprises:
forming an intermediate insulating layer over the memory structure, the intermediate insulating layer having a first portion in the memory region and a second portion in the logic region;
forming an intermediate stop layer over the intermediate insulating layer, the intermediate stop layer having a first portion in the memory region and a second portion in the logic region; and
removing the first portion of the intermediate stop layer and a part of the first portion of the intermediate insulating layer.

15. The method of claim 14, wherein forming the first insulating layer and the stop layer further comprises:
forming a further intermediate insulating layer over the intermediate stop layer, wherein the further intermediate insulating layer comprises a first portion in the memory region and a second portion in the logic region; and
wherein removing the first portion of the intermediate stop layer and a part of the first portion of the intermediate insulating layer further comprises removing both the first portion and the second portion of the further intermediate insulating layer.

16. The method of claim 13, wherein the further insulating layer has a first portion in the memory region and a second portion in the logic region, wherein a thickness of the first portion of the further insulating layer is greater than a thickness of the second portion of the further insulating layer, and wherein the first insulating layer is formed over the further insulating layer.

17. The method of claim 16, further comprising forming a first memory contact at least partially within the base layer in the memory region, wherein the memory structure is formed to contact the first memory contact.

18. The method of claim 17, further comprising forming a blocking layer, wherein the blocking layer is between the base layer and the further insulating layer.

19. The semiconductor device of claim 12, wherein the second logic contact is arranged at least partially in the second insulating layer, extends through the stop layer, and is arranged partially in the first insulating layer.

20. The semiconductor device of claim 12, further comprising:
a third logic contact arranged within a logic region,
wherein the third logic contact includes electrically conductive material,
wherein the third logic contact is arranged at least partially within the base layer.

* * * * *